United States Patent
Barabash et al.

(10) Patent No.: US 9,431,569 B2
(45) Date of Patent: Aug. 30, 2016

(54) ZINC BLENDE CADMIUM—MANGANESE—TELLURIDE WITH REDUCED HOLE COMPENSATION EFFECTS AND METHODS FOR FORMING THE SAME

(71) Applicant: First Solar, Inc., Tempe, AZ (US)

(72) Inventors: Sergey Barabash, San Jose, CA (US); Amir Bayati, San Jose, CA (US); Dipankar Pramanik, Saratoga, CA (US); Zhi-Wen Sun, Sunnyvale, CA (US)

(73) Assignee: First Solar, Inc., Tempe, AZ (US)

( * ) Notice: Subject to any disclaimer, the term of this patent is extended or adjusted under 35 U.S.C. 154(b) by 0 days.

(21) Appl. No.: 14/141,408

(22) Filed: Dec. 26, 2013

(65) Prior Publication Data
US 2015/0187982 A1 Jul. 2, 2015

(51) Int. Cl.
*C01B 19/00* (2006.01)
*H01L 35/16* (2006.01)
*H01L 31/18* (2006.01)

(52) U.S. Cl.
CPC ....... *H01L 31/1832* (2013.01); *H01L 31/1836* (2013.01); *Y02P 70/521* (2015.11)

(58) Field of Classification Search
CPC .... C23C 14/0623; H01L 35/16; C01B 19/00
See application file for complete search history.

(56) References Cited

U.S. PATENT DOCUMENTS

| | | |
|---|---|---|
| 4,885,067 A | 12/1989 | Doty |
| 4,935,383 A | 6/1990 | Nouhi et al. |
| 7,901,975 B2 | 3/2011 | Chen |
| 2014/0046083 A1* | 2/2014 | Tilyou .................. B32B 5/16 556/19 |
| 2014/0094025 A1* | 4/2014 | Korevaar et al. .......... 438/558 |

* cited by examiner

*Primary Examiner* — Mohammad Choudhry
(74) *Attorney, Agent, or Firm* — MacMillan, Sobanski & Todd, LLC

(57) ABSTRACT

Embodiments provided herein describe methods for forming cadmium-manganese-telluride (CMT), such as for use in photovoltaic devices. A substrate including a material with a zinc blend crystalline structure is provided. CMT is formed above the substrate. During the formation of the CMT, cation-rich processing conditions are maintained. The resulting CMT may be more readily provided with p-type dopants when compared to conventionally-formed CMT.

14 Claims, 11 Drawing Sheets

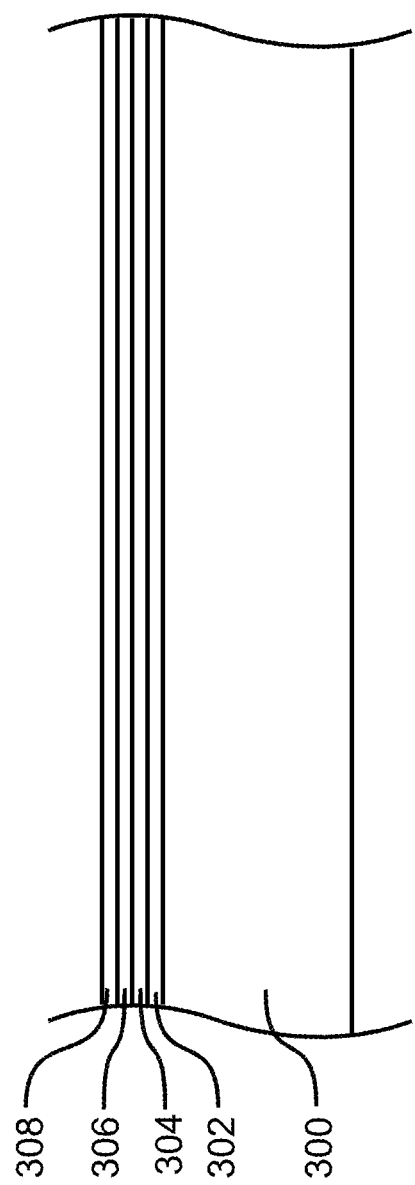

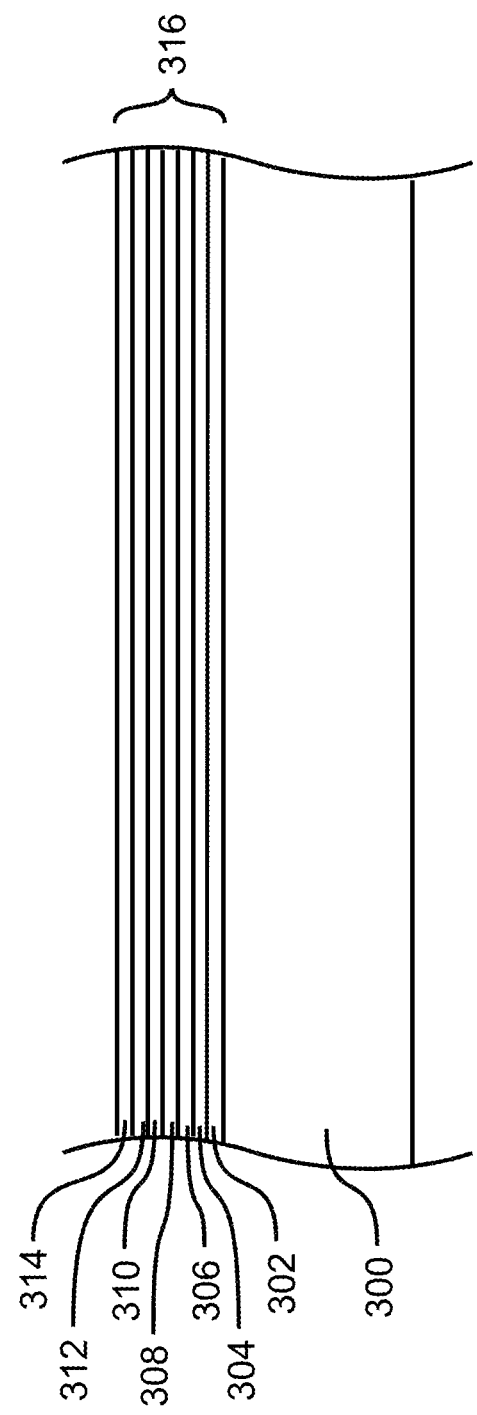

ZINC BLENDE CADMIUM—MANGANESE—TELLURIDE WITH REDUCED HOLE COMPENSATION EFFECTS AND METHODS FOR FORMING THE SAME

The present invention relates to cadmium-manganese-telluride (CMT), such as for use in, for example, photovoltaic devices. More particularly, this invention relates to zinc blende CMT with reduced hole compensation effects and methods for forming such CMT.

BACKGROUND OF THE INVENTION

Photovoltaic devices (or cells) are often manufactured by forming or depositing a light-absorbing layer, along with various other layers, onto a transparent (e.g., glass) substrate. Among the other layers formed are a front contact, typically formed between the substrate and the light absorbing layer, and a back contact, typically formed on a side of the light-absorbing layer opposite the substrate, and perhaps an electron reflector layer formed between the light-absorbing layer and the back contact. One possibility for the material used in the electron reflector layer is cadmium-manganese-telluride (CMT).

In order to maximize the performance of CMT for use in photovoltaic devices, it is generally considered to require doping (e.g., p-type doping). The ideal cation vs. anion composition, and the methods of achieving such, have yet to be established.

There are two opposing ideas regarding cation vs. anion composition depending on the method of doping. Doping may be introduced either by internal defects, in particular cadmium vacancies, or by external dopants, such as copper. In the former case, one seeks cadmium-poor conditions. In the latter, one might consider using cadmium-rich conditions. Based on conventional wisdom related to the use of cadmium telluride in photovoltaic devices, it is generally assumed that cadmium vacancies are desirable.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 5 is a cross-sectional side view of the substrate of FIG. 4 with a cadmium or manganese monolayer formed above the CMT monolayers.

FIG. 6 is a cross-sectional side view of the substrate of FIG. 5 with CMT monolayers formed above the cadmium or manganese monolayer.

DETAILED DESCRIPTION

Figure 1:
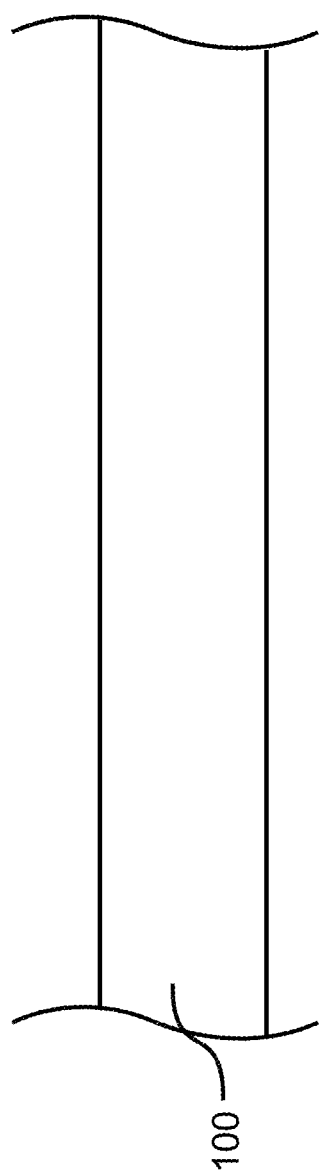
FIG. 1 is a cross-sectional side view of a substrate according to some embodiments.

A detailed description of one or more embodiments is provided below along with accompanying figures. The detailed description is provided in connection with such embodiments, but is not limited to any particular example. The scope is limited only by the claims, and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

In some embodiments, methods are provided for forming cadmium-manganese-telluride (CMT) in such a way that the ability to provide p-type doping for the CMT is improved. This may be accomplished by epitaxially growing (or depositing) the CMT in cation-rich and tellurium-poor conditions. When formed in such processing conditions, the formation of competing phases, such as binary manganese tellurides (e.g., MnTe or $MnTe_2$), or any non-zinc-blende phases in zinc-blende CMT can be inhibited, while the compensating role of native defects, such as tellurium-on-cadmium anti-sites, may be reduced. As a result, a zinc-blende CMT phase may be formed in which any external hole dopants remain largely uncompensated, with residual compensation being provided by cadmium occupying tellurium sites as opposed to tellurium occupying cadmium sites. It may then be possible to achieve relatively good p-doping of zinc-blende CMT using external dopants, substantially exceeding p-doping that can be achieved in CMT with native defects, such as cadmium vacancies, or with external dopants in a material grown under different conditions.

In some embodiments, the CMT is deposited on a material with a zinc blende crystal structure, such as cadmium telluride. The CMT may be deposited using, for example, physical vapor deposition (PVD) (e.g., sputtering) and/or atomic layer deposition (ALD). The processing temperature during deposition may be maintained above room temperature but below about 600° C. to maintain a preference for epitaxially matched phases.

Cation-rich conditions may be maintained during the deposition of the CMT. In some embodiments, the cation-rich conditions are maintained by introducing dimethyl cadmium into the processing chamber during deposition. In some embodiments, such as those utilizing PVD, an additional cadmium, manganese, and/or cadmium-manganese alloy target is used during the sputter deposition. In some embodiments, such as those utilizing ALD (perhaps in combination with PVD), monolayers of cadmium or manganese are intermittently formed during the formation of the CMT layer while the processing temperature is maintained at greater than about 350° C. (e.g., between about 350° C. and about 600° C.).

It should be understood that although the methods described below may utilize the CMT in a photovoltaic device (e.g., as an electron reflector layer), in some embodiments, the CMT may be used in other devices or systems, and as such, may be formed above any material(s) suitable for various uses.

Figure 2:
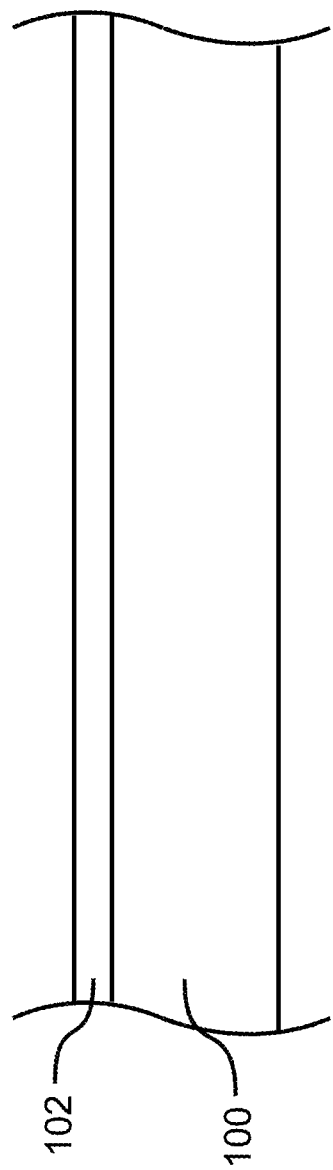
FIG. 2 is a cross-sectional side view of the substrate of FIG. 1 with a cadmium-manganese-telluride (CMT) layer formed above.

FIGS. 1 and 2 illustrate a method for forming (or depositing or growing) zinc blende CMT according to some embodiments. Referring to FIG. 1, a substrate 100 according to some embodiments is illustrated. In some embodiments, the substrate 100 includes (or is made of) a material with a zinc blende crystal structure. For example, the substrate 100 may be made of cadmium telluride. However, in some embodiments, the substrate may (also) include a transparent material (e.g., glass) with other materials (e.g., suitable for forming a photovoltaic device) formed thereon (e.g., below the cadmium telluride).

Referring to FIG. 2, in some embodiments, a CMT layer 102 is formed above the substrate 100 (e.g., on an upper surface thereof) in an epitaxial manner (i.e., such that the crystal structure of the CMT matches, or substantially matches, that of the substrate 100). In some embodiments, the CMT layer 102 is formed using PVD, ALD, or a combination thereof. In some embodiments, during the growth, or deposition, of the CMT, the processing temperature is maintained at above room temperature (e.g., above 20-25° C.) to provide reasonable diffusion, but below about 600° C. to maintain a preference for epitaxially matched phases. Depending on deposition method, the temperature may be adjusted so as to avoid precipitation of non-epitaxially-matched phases, such as manganese-telluride ($MnTe_2$) or hexagonal manganese-telluride (MnTe).

A hypothetical defect-free zinc-blende compound has equal number of cations and anions. Actual zinc-blende compounds may contain native defects, such as point defects. For example, CMT may contain point defects including, for example, cadmium vacancies, tellurium vacancies, cadmium-on-tellurium antisites, or tellurium-on-cadmium antisites. Due to the presence of native defects, the cation content may deviate from the anion content. The defect contents may depend on processing conditions. For example, the number of defects may be determined by the cation and anion chemical potentials, which represent the effect of the chemical and physical conditions. Increasing cation and decreasing anion chemical potentials correspond to making the conditions more cation rich so that the cation content in CMT can increase and the anion content can decrease. Decreasing cation and increasing anion chemical potentials correspond to making the conditions more cation poor so that the cation content in CMT can decrease and the anion content can increase. Depending on processing conditions, CMT may have different contents of native defects.

When CMT is deposited in thermodynamic equilibrium, the cation and anion chemical potentials are interrelated and may vary within a certain range. If the chemical potentials are outside of this range, one or more of competing phases may form instead of CMT. For example, if conditions become too cation-poor, $MnTe_2$ can precipitate and grow at the expense of CMT.

In some embodiments, during the deposition of the CMT layer 102, strongly cation-rich conditions are maintained. The cation-rich conditions may result in a cation content at or beyond one allowed in a full thermodynamic equilibrium because of the kinetic suppression of non-epitaxially-matched phases. In some embodiments, the cation-rich processing conditions are maintained by introducing dimethyl cadmium ($Cd(CH_3)_2$) into the processing chamber during the growth/deposition process (e.g., when using either PVD or ALD).

In some embodiments utilizing PVD, the cation-rich processing conditions are maintained by using, for example, an additional cadmium, manganese, and/or cadmium-manganese alloy target during the deposition process. For example, the CMT layer 102 may be formed by simultaneously sputtering (or co-sputtering) material from three targets, such as a cadmium-telluride target, a manganese-telluride target, and a cadmium (or manganese) target.

Figure 3:
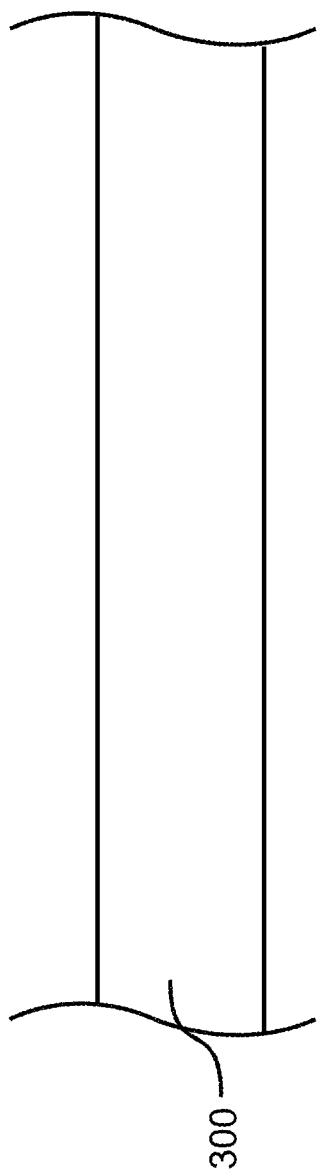
FIG. 3 is a cross-sectional side view of a substrate according to some embodiments.

FIGS. 3-6 illustrate a method for forming zinc blende CMT according to some embodiments. Referring to FIG. 3, a substrate 300 is illustrated. In some embodiments, the substrate 300 is similar that the substrate 100 (FIGS. 1 and 2) described above and includes (or is made of) a material with a zinc blende crystal structure (e.g., cadmium telluride).

It should be understood that the method illustrated in FIGS. 3-6 may be used in combination with the method illustrated in FIGS. 1 and 2. As such, in some embodiments, the substrate 300 is, for example, a cadmium-telluride substrate with a CMT layer formed thereon in a manner similar to that described above (e.g., the substrate 100 with the CMT layer 102 shown in FIG. 2).

Figure 4:
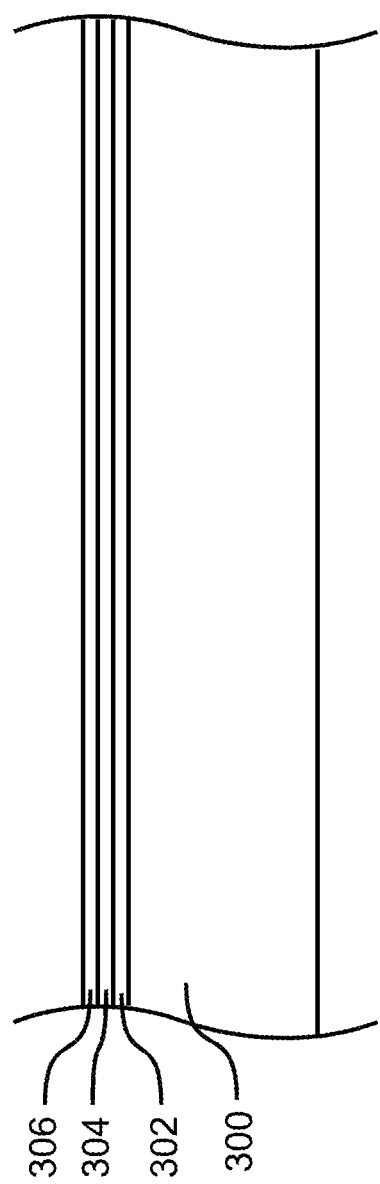
FIG. 4 is a cross-sectional side view of the substrate of FIG. 3 with CMT monolayers formed above.

Referring to FIG. 4, monolayers 302, 304, and 306 are successively formed above the substrate 300 (or on the upper surface thereof). In some embodiments, the monolayers 302, 304, and 306 are made of CMT and are formed using, for example, ALD. As with the method described above, during the growth/deposition process of the monolayers 302, 304, and 306, the processing temperature (e.g., within the ALD processing chamber) is maintained between about 20-25° C. and about 600° C. (e.g., to maintain a preference for epitaxially matched phases), preferably between about 350° C. and about 600° C. Although three monolayers 302, 304, and 306 are shown as being formed, in some embodiments, in the processing step depicted in FIG. 4, fewer monolayers are formed (e.g., one or two monolayers).

As shown in FIG. 5, monolayer 308 is then formed above the top-most monolayer formed in the processing step depicted in FIG. 4 (e.g., monolayer 308). In some embodiments, monolayer 308 is made of cadmium, while in some embodiments monolayer 310 is made of manganese. Monolayer 308 may be formed using, for example, ALD, while maintain a processing temperature of between about 20-25° C. and about 600° C., preferably between about 350° C. and about 600° C.

Referring to FIG. 6, monolayers 310, 312, and 314 are then successively formed above monolayer 308. Monolayers 310, 312, and 314 may be made of CMT and be formed using ALD. During the formation of monolayers 310, 312, and 314, the processing temperature may be maintained between about 350° C. and about 600° C. to ensure sufficient diffusion to result in a homogeneous zinc blende phase. Monolayers 302-314 may jointly form a layer 316 which may be referred to as a "laminate" CMT layer (although monolayer 308 may be cadmium or manganese). Although not specifically shown, the method depicted in FIGS. 4-6 may be repeated to increase the thickness of the laminate CMT layer 116 as desired.

Additionally, as alluded to above, the method depicted in FIGS. 4-6 may be used in combination with the method depicted in FIGS. 1 and 2. For example, CMT may first be deposited using, for example, PVD as described with respect to FIG. 2. Then, for example, a cadmium or manganese monolayer may be formed using ALD as described with respect to FIG. 5 (i.e., with or without first forming the CMT monolayers as depicted in FIG. 4).

The methods depicted in FIGS. 1-6 may result in the CMT (e.g., CMT layer 102 and/or the laminate CMT layer 116) being formed in such a way (i.e., cation-rich and tellurium-poor conditions) to, for example, inhibit the formation of manganese-telluride in the CMT. When formed under such processing conditions, the role of tellurium-on-cadmium antisites in the CMT may reduced, and any external hole dopants remain largely uncompensated such that any residual compensation may be provided by cadmium occupying tellurium sites as opposed to tellurium occupying cadmium sites. The resulting CMT may be more easily provided with p-doping using external dopants (e.g., boron, gallium, etc.).

Native defects can exist in different charge states, such as neutral, negatively charged, or positively charged. The formation energies of both neutral and charged native defects depend on the chemical potentials of cations and anions. In addition, the formation energies of charged defects depend on the energy of the Fermi level. In a semiconductor, the energy of the Fermi level is typically positioned inside the semiconductor band gap, between the conduction band and the valence band. The position of the Fermi level corresponds to the overall doping of the material. For example, moving the Fermi level from the conduction band towards the valence band corresponds to increasing the hole doping or reducing the electron doping of the material.

Figure 8:
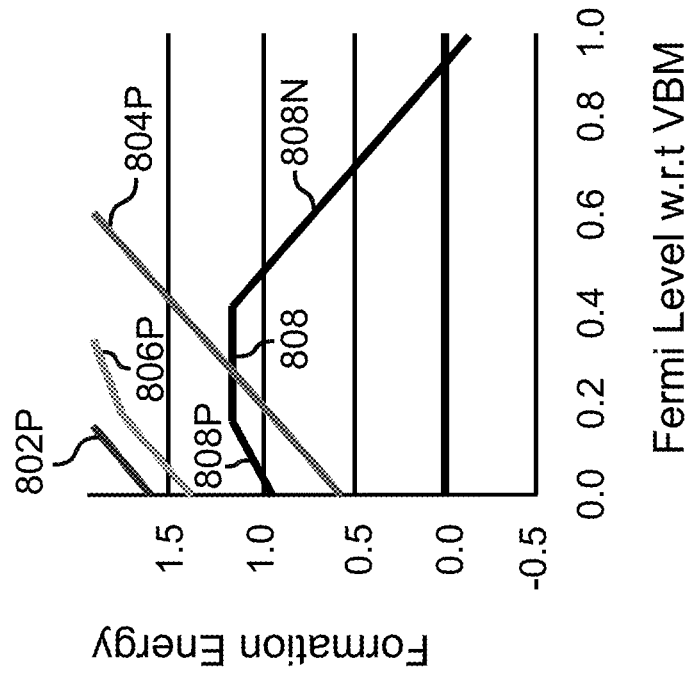
FIG. 8 is a graph depicting formation energies for various Fermi levels of CMT formed according to some embodiments.
Figure 7:
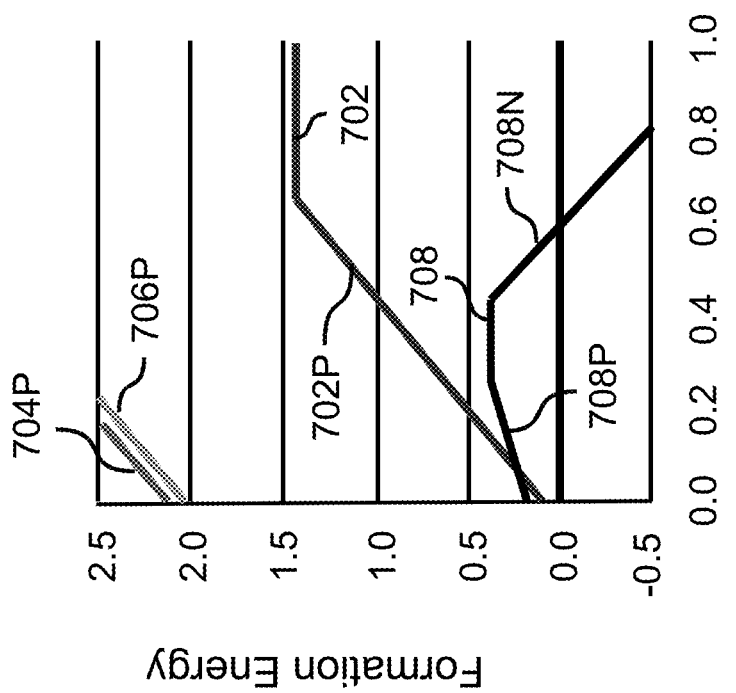
FIG. 7 is a graph depicting formation energies for various Fermi levels of conventionally-formed CMT.

Formation energies of native defects may be estimated using calculations employing density-functional theory (DFT). Calculations employing DFT rely on certain approximations, including the specific form of the density functional used for the calculations. In a magnetic alloy material such as CMT, the approximations also include the models for chemical and magnetic ordering. One of the typical DFT errors resulting from such approximations is an underestimated value of the band gap between the conduction band and the valence band of a semiconductor. The band gap error can introduce an uncertainty in the formation energies of charged defects by changing the possible range of the Fermi level energies. Additional approximate error correction terms may be employed to reduce some of the DFT errors, although some such corrections can introduce additional errors, e.g. for defects exhibiting amphoteric behavior. FIGS. 7 and 8 illustrate the DFT formation energies estimated using one such set of possible approximations for calculations performed in the local-density approximation in a magnetically and chemically ordered model of CMT. As will be appreciated by one skilled in the art, the use of different approximations may modify the plots shown in FIGS. 7 and 8.

FIG. 7 graphically illustrates the simplified formation energy diagram at various Fermi levels with respect to valence band maximum (VBM), in tellurium-rich, cation-poor CMT (e.g., conventionally formed CMT) of tellurium occupying cadmium sites (i.e., an anti-site), tellurium vacancies, and cadmium vacancies, as may be obtained from DFT calculations after applying some additional error corrections. For visual clarity, only the portions of the formation energy diagram relevant to subsequent discussion is shown, for Fermi level positions within 1 eV from VBM.

Specifically, in FIG. 7, lines (or line segments) 702 and 702P depict the formation energy of tellurium occupying a cadmium site in neutral (702) and positively charged (702P) states, line 704P depicts the formation energy of cadmium occupying a tellurium site in a positively charged state, line 706P depicts the estimated formation energy of tellurium vacancies in a positively charged state, and lines 708, 708P and 708N depict the estimated formation energy of cadmium vacancies in neutral (708), positively (708P) and negatively (708N) charged states. The data depicted in FIG. 7 suggest that cadmium vacancies or other native defects can not provide a substantial degree of hole doping in CMT. In particular, DFT data suggest that cadmium vacancies can be efficient in providing hole doping only when the Fermi level is more than 0.4 eV above VBM (e.g., line 708N). Such Fermi level positions correspond to very low hole concentrations. However, as the hole doping increases (i.e., the Fermi level gets closer to VBM), tellurium occupying cadmium sites can strongly compensate both cadmium vacancies and other dopants in CMT, as suggested by the very low energy of tellurium-on-cadmium antisites in segment 702P. Moreover, the data suggest that even cadmium vacancies may start compensating other dopants in heavily externally doped CMT materials obtained under tellurium-rich, cation-poor conditions, as suggested by the amphoteric segment 708P that can be obtained with some DFT error correction schemes.

The data depicted in FIG. 7 also suggest that if a material is grown under tellurium-rich (or cation-poor) conditions, the effect of external dopants can be strongly compensated (e.g., by the tellurium-on-cadmium antisites). The Fermi level in such material can be pinned at a substantial distance from VBM (e.g., >0.3 eV), nearly independent of temperature and presence of external dopants. This demonstrates that cadmium vacancies should be avoided, not sought as in cadmium-telluride.

FIG. 8 graphically illustrates the simplified formation energy diagram at various Fermi levels (with respect to VBM), in CMT formed in accordance with some embodiments (e.g., tellurium-poor, cation-rich CMT), of tellurium occupying cadmium sites, cadmium occupying tellurium sites, tellurium vacancies, and cadmium vacancies, as can be obtained from DFT calculations after applying some additional error corrections.

Specifically, in FIG. 8, line 802P depicts the estimated formation energy of tellurium occupying a cadmium site in a positively charged state, line 804P depicts the estimated formation energy of cadmium occupying a tellurium site in a positively charged state, line 806P depicts the estimated formation energy of tellurium vacancies in a positively charged state (actually two positively charged states), and lines 808, 808P and 808N depict the estimated formation energy of cadmium vacancies in neutral (808), positively (808P) and negatively (808N) charged states.

FIG. 8 illustrates that in a material grown under cation-rich (or tellurium-poor) conditions, the hole-compensating defects have a high formation energy (in excess of 0.5 eV)

even when the Fermi level is close to the VBM. As a result, a zinc-blende CMT phase may be formed in which any external hole dopants remain largely uncompensated, with residual compensation being provided by cadmium occupying tellurium sites (as opposed to tellurium occupying cadmium sites in CMT grown in other conditions). It may then be possible to achieve relatively good p-doping of zinc-blende CMT using external dopants, substantially exceeding p-doping that can be achieved in CMT with native defects, such as cadmium vacancies, or with external dopants in a material grown under different conditions.

Figure 9:
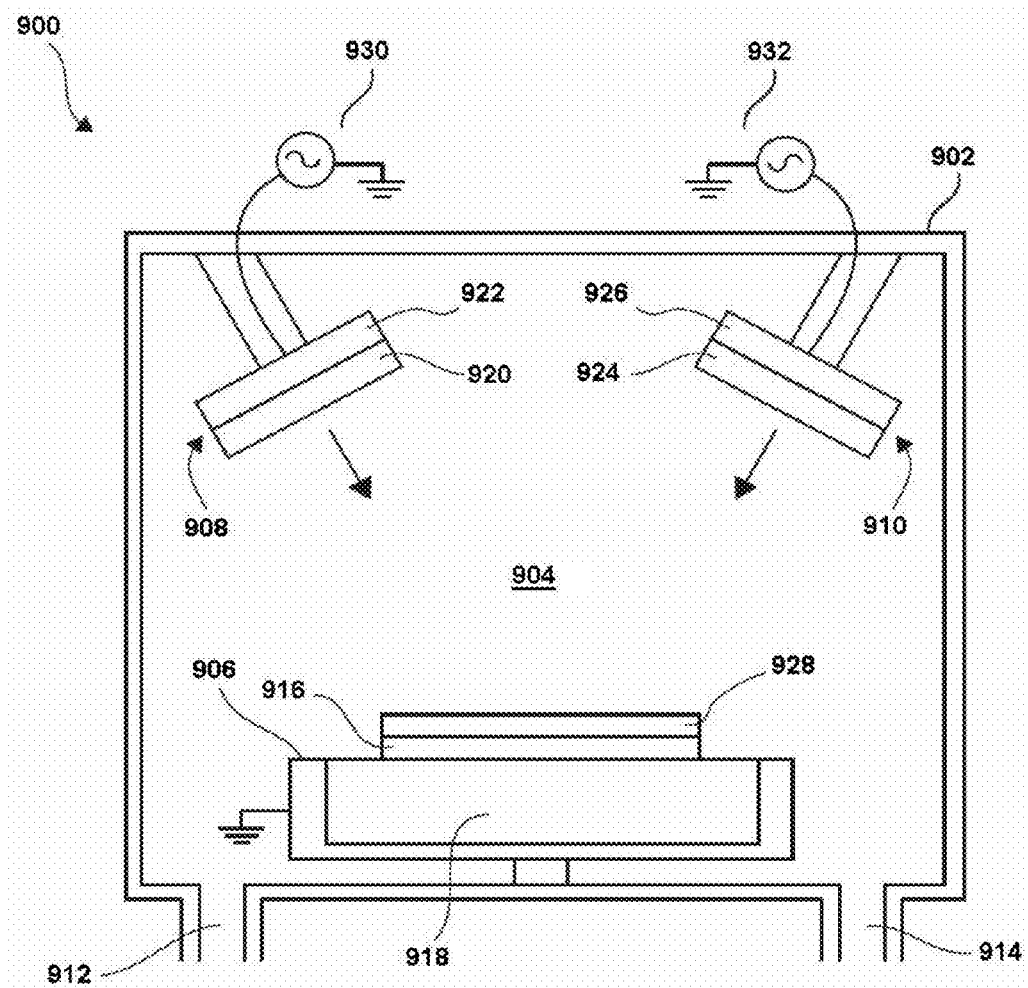
FIG. 9 is a simplified cross-sectional diagram of a physical vapor deposition (PVD) tool according to some embodiments.

FIG. 9 provides a simplified illustration of a physical vapor deposition (PVD) tool (and/or system) 900 which may be used, in some embodiments, to form zinc blende CMT as described above (and/or at least some components of a photovoltaic device). The PVD tool 900 shown in FIG. 9 includes a housing 902 that defines, or encloses, a processing chamber 904, a substrate support 906, a first target assembly 908, and a second target assembly 910.

The housing 902 includes a gas inlet 912 and a gas outlet 914 near a lower region thereof on opposing sides of the substrate support 906. The substrate support 906 is positioned near the lower region of the housing 902 and in configured to support a substrate 916. The substrate 916 may be a round substrate having a diameter of, for example, about 200 mm or about 300 mm. In other embodiments (such as in a manufacturing environment), the substrate 916 may have other shapes, such as square or rectangular, and may be significantly larger (e.g., about 0.5-about 6 m across). The substrate support 906 includes a support electrode 918 and is held at ground potential during processing, as indicated.

The first and second target assemblies (or process heads) 908 and 910 are suspended from an upper region of the housing 902 within the processing chamber 904. The first target assembly 908 includes a first target 920 and a first target electrode 922, and the second target assembly 910 includes a second target 924 and a second target electrode 926. As shown, the first target 920 and the second target 924 are oriented or directed towards the substrate 916. As is commonly understood, the first target 920 and the second target 924 include one or more materials that are to be used to deposit a layer of material 928 on the upper surface of the substrate 916.

The materials used in the targets 920 and 924 may, for example, include cadmium, tellurium, manganese, zinc, indium, gallium, tin, magnesium, aluminum, lanthanum, yttrium, titanium, antimony, strontium, bismuth, silicon, silver, nickel, chromium, niobium, any other material(s) described above, or any combination thereof (i.e., a single target may be made of an alloy of several metals). Additionally, the materials used in the targets may include oxygen, nitrogen, or a combination of oxygen and nitrogen in order to form oxides, nitrides, and oxynitrides.

Additionally, although only two targets 920 and 924 are shown, additional (three or more) targets may be used. For example, in some embodiments, the PVD tool includes three targets, with the first target including (or being made of) cadmium-telluride, the second target including manganese-telluride, and the third target including cadmium or manganese. Such an embodiment may be used to form the CMT under cation-rich processing conditions as described above.

The PVD tool 900 also includes a first power supply 930 coupled to the first target electrode 922 and a second power supply 932 coupled to the second target electrode 924. As is commonly understood, in some embodiments, the power supplies 930 and 932 pulse direct current (DC) power to the respective electrodes, causing material to be, at least in some embodiments, simultaneously sputtered (i.e., co-sputtered) from the first and second targets 920 and 924. In some embodiments, the power is alternating current (AC) to assist in directing the ejected material towards the substrate 916.

During sputtering, inert gases (or a plasma species), such as argon or krypton, may be introduced into the processing chamber 904 through the gas inlet 912, while a vacuum is applied to the gas outlet 914. The inert gas(es) may be used to impact the targets 920 and 924 and eject material therefrom, as is commonly understood. In embodiments in which reactive sputtering is used, reactive gases, such as oxygen and/or nitrogen, may also be introduced, which interact with particles ejected from the targets (i.e., to form oxides, nitrides, and/or oxynitrides). As described above, in some embodiments, cadmium dimethyl gas in introduced into the processing chamber 904 during the formation of CMT as described above.

Although not shown in FIG. 9, the PVD tool 900 may also include a control system having, for example, a processor and a memory, which is in operable communication with the other components shown in FIG. 9 and configured to control the operation thereof in order to perform the methods described herein.

Although the PVD tool 900 shown in FIG. 9 includes a stationary substrate support 906, it should be understood that in a manufacturing environment, the substrate 916 may be in motion (e.g., an in-line configuration) during the formation of various layers described herein.

Figure 10:
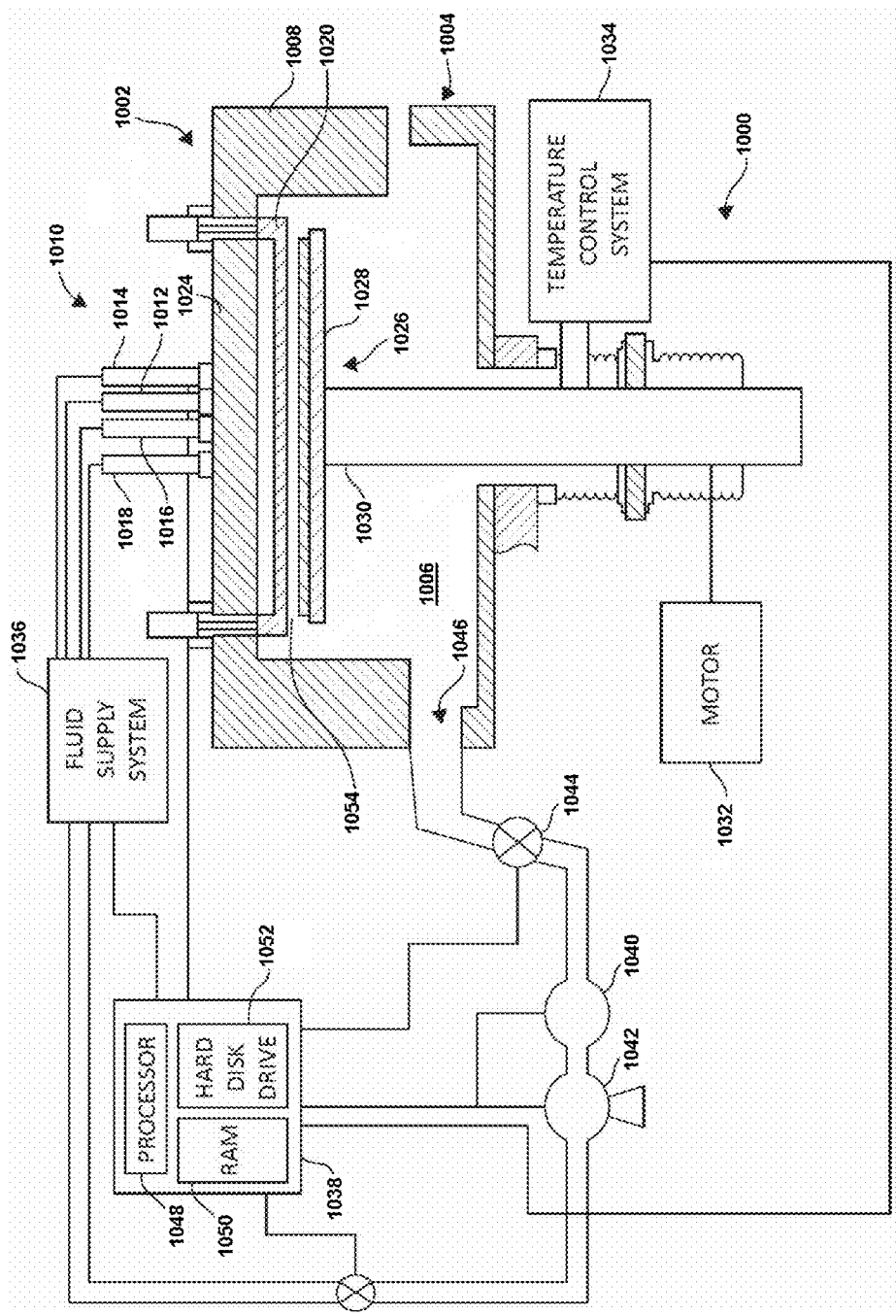
FIG. 10 is a cross-sectional schematic view of an atomic layer deposition (ALD) tool according to some embodiments.

FIG. 10 provides a simplified illustration of an ALD tool (and/or chamber and/or system) 1000 which may be used, in some embodiments, to form zinc blende CMT as described above (and/or at least some components of a photovoltaic device).

The tool 1000 includes an enclosure assembly 1002 formed from a process-compatible material, such as aluminum or anodized aluminum. The enclosure assembly 1002 includes a housing 1004, which defines a processing chamber 1006, and a vacuum lid assembly 1008 covering an opening to the processing chamber 1006 at an upper end thereof. Although only shown in cross-section, it should be understood that the processing chamber 1006 is enclosed on all sides by the housing 1004 and/or the vacuum lid assembly 1008.

A process fluid injection assembly 1010 is mounted to the vacuum lid assembly 1008 and includes a plurality of passageways (or injection ports) 1012, 1014, 1016, and 1018 and a showerhead 1020 to deliver reactive and carrier fluids into the processing chamber 1006. In the embodiment depicted in FIG. 10, the showerhead 1020 is moveably coupled to an upper portion of the vacuum lid assembly 1008 (i.e., a backing plate 1024). The showerhead 1020 may be formed from any known material suitable for the application, including stainless steel, aluminum, anodized aluminum, nickel, ceramics and the like.

Referring again to FIG. 10, the tool 1000 also includes a heater/lift assembly 1026 disposed within processing chamber 1006. The heater/lift assembly 1026 includes a support pedestal (or substrate support) 1028 connected to an upper portion of a support shaft 1030. The support pedestal 1028 is positioned between shaft 1030 and the backing plate 1024 and may be formed from any process-compatible material, including aluminum nitride and aluminum oxide. The support pedestal 1028 is configured to hold or support a substrate and may be a vacuum chuck, as is commonly understood, or utilize other conventional techniques, such as an electrostatic chuck (ESC) or physical clamping mechanisms, to prevent the substrate from moving on the support pedestal 1028. The support shaft 1030 is moveably coupled to the housing 1004 so as to vary the distance between support pedestal 1028 and the backing plate 1024. That is, the support shaft 1030 may be vertically moved to vary the distance between the support pedestal 1028 and the backing plate 1024. In the depicted embodiment, a lower portion of the support shaft 1030 is coupled to a motor 1032 which is configured to perform this movement. Although not shown, a sensor may provide information concerning the position of the support pedestal 1028 within processing chamber 1006.

The support pedestal 1028 may be used to heat the substrate through the use of heating elements (not shown) such as resistive heating elements embedded in the pedestal assembly. In the embodiment shown in FIG. 10, a temperature control system 1034 is provided to control the heating elements, as well as maintain the chamber housing 1004, vacuum lid assembly 1008, and showerhead 1020 within desired temperature ranges in a conventional manner.

Still referring to FIG. 10, the tool 1000 also includes a fluid supply system 1036 and a controller (or system control system) 1038. The fluid supply system 1036 is in fluid communication with the passageways 1012, 1014, 1016, and 1018 through a sequence of conduits (or fluid lines).

The fluid supply system 1036 (and/or the controller 1038) controls the flow of processing fluids to, from, and within the processing chamber 1006 are with a pressure control system that includes, in the embodiment shown, a turbo pump 1040 and a roughing pump 1042. The turbo pump 1040 and the roughing pump 1042 are in fluid communication with processing chamber 1006 via a butterfly valve 1044 and a pump channel 1046.

The controller 1038 includes a processor 1048 and memory, such as random access memory (RAM) 1050 and a hard disk drive 1052. The controller 1038 is in operable communication with the various other components of the tool 1000, including the turbo pump 1040, the temperature control system 1034, the fluid supply system 1036, and the motor 1032 and controls the operation of the entire processing module to perform the methods and processes described herein.

During operation, the tool 1000 establishes conditions in a processing region 1054 between an upper surface of the substrate and the showerhead 1020, such as injecting precursors (or reagents), as well as purge gases, to form the desired material on the surface of the substrate.

Figure 11:
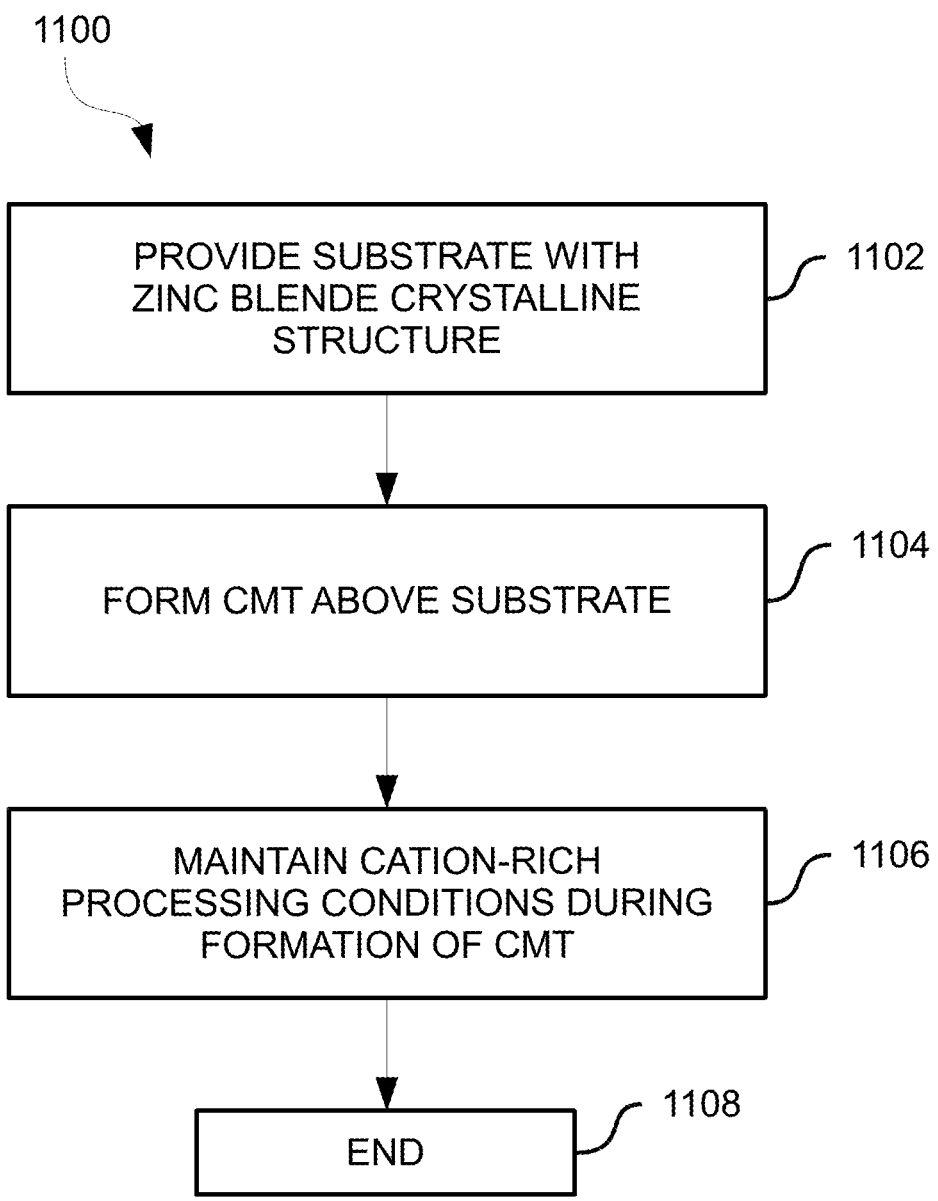
FIG. 11 is a flow chart illustrating a method for forming CMT according to some embodiments.

FIG. 11 is a flow chart illustrating a method 1100 for forming CMT according to some embodiments. At block 1102, the method begins by providing a substrate. In some embodiments, the substrate is made of a material that has a zinc blende crystalline structure, such as cadmium-telluride. In some embodiments, the substrate is provided by positioning the substrate on a substrate support in a processing chamber of, for example, a PVD or ALD tool.

At block 1104, CMT is formed (or grown or deposited) above the substrate. As described above, the formation of the CMT may be performed using, for example, PVD, ALD, or a combination thereof (e.g., alternating between PVD and ALD). In some embodiments, the processing temperature is maintained between about 20-25° C. and about 600° C. to maintain preference for epitaxially matched phases.

At block 1106, cation-rich (and tellurium-poor) processing conditions are maintained (e.g., within the PVD and/or ALD processing chamber) during the formation of the CMT. In some embodiments, the cation-rich processing conditions are maintained by introducing cadmium dimethyl into the processing chamber during the growth/deposition process (e.g., when using either PVD or ALD). In some embodiments utilizing PVD, the cation-rich processing conditions are maintained by using an additional cadmium or manganese target during the deposition process. For example, the CMT may be formed by simultaneously sputtering (or co-sputtering) material from three targets, such as a cadmium-telluride target, a manganese-telluride target, and a cadmium (or manganese) target).

In some embodiments, the cation-rich processing conditions are maintained by intermittently forming a monolayer of cadmium or manganese using, for example, ALD, perhaps in combination with the formation of three or less monolayers of CMT. During the formation of the monolayers, the processing temperature may be maintained at between about 350° C. and about 600° C. to ensure sufficient diffusion which will result in a homogeneous zinc blende phase.

In some embodiments, the CMT is utilized in a photovoltaic device. As such, although not shown, the method 1100 may include the formation of additional components of a photovoltaic device, such as a front contact and a window low, as described above. Additionally, in some embodiments, the substrate includes glass, or another transparent material (e.g., the cadmium-telluride is formed above a glass substrate). At block 1108, the method ends.

Figure 12:
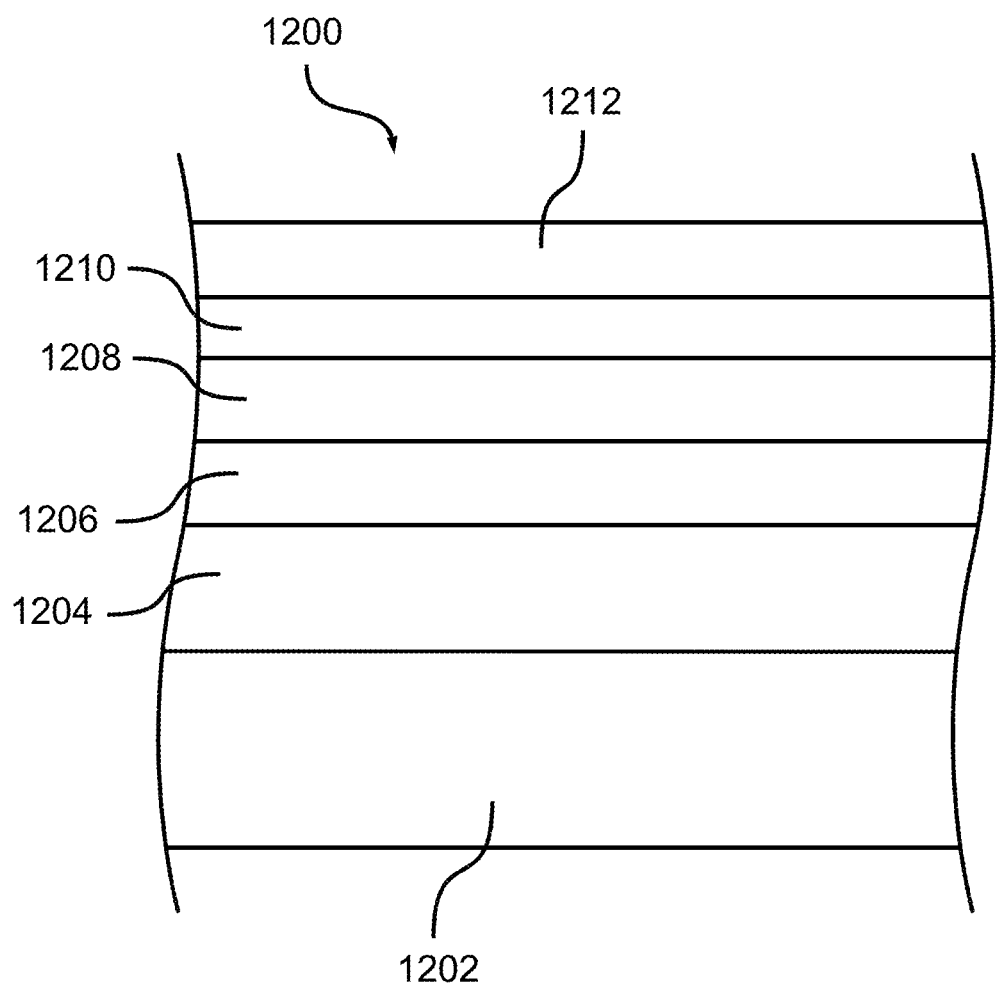
FIG. 12 is a cross-sectional side view of a photovoltaic device according to some embodiments.

FIG. 12 illustrates an exemplary photovoltaic device 1200 according to some embodiments. In some embodiments, the photovoltaic device is CMT-based (i.e., utilizes CMT in the light-absorbing layer, as described below). In the depicted embodiment, the photovoltaic device includes a substrate 102, a front contact (or contact layer) 104, a window layer 106, a light-absorbing layer 108, an electron reflector layer 110, and a back contact 112.

The substrate 1202 may be transparent. In some embodiments, the substrate 102 is made of a low emissivity glass, such as borosilicate glass or soda lime glass. However, in some embodiments, the transparent substrate 1202 may be made of sodium-free glass. In some embodiments, other materials may be used, such as plastic or a transparent polymer, such as polyethylene terephthalate (PET), poly (methyl methacrylate) (PMMA), polycarbonate (PC), and polyimide (PI). The transparent substrate 102 has a thickness of, for example, between about 1 and about 10 millimeters (mm). In a testing environment, the transparent substrate 1202 may be round with a diameter of, for example, about 200 or about 300 mm. However, in a manufacturing environment, the transparent substrate 102 may be square or rectangular and significantly larger (e.g., between about 0.5 meters (m) and about 6 m across).

The various layers/components 1204-1212 of the photovoltaic device 1200 may be formed sequentially (i.e., from bottom to top) above the transparent substrate 1202 using, for example, physical vapor deposition (PVD) and/or reactive sputtering, DC or AC sputtering, low pressure chemical vapor deposition (CVD), atmospheric pressure CVD, plasma-enhanced chemical vapor deposition (PECVD), thermal chemical vapor deposition, spin-on deposition, and spray-pyrolysis. In some embodiments, the layers/components 1204-1212 are formed above the entire substrate 1202. However, in some embodiments, the layers/components 1204-1212 may only be formed above isolated portions of the transparent substrate 1202.

Although the layers may be described as being formed "above" the previous layer (or the substrate), it should be understood that in some embodiments, each layer is formed directly on (and adjacent to) the previously provided/formed component (e.g., layer). In some embodiments, additional layers may be included between the layers, and other processing steps (e.g., such an annealing/heating processes) may also be performed between the formation of various layers.

Still referring to FIG. 12, the front contact (or front contact layer) 1204 is formed above the substrate 1202. In some embodiments, the front contact includes a transparent conductive oxide (TCO), such as indium tin oxide (ITO). However, other materials may also be used in the front contact, such as cadmium oxide, indium oxide, gallium oxide, cadmium-indium oxide, indium-tin oxide, zinc oxide, tin oxide, and zinc-tin oxide. Additionally, although the front contact 1204 is shown as only one layer, the front contact 1204 may include multiple sub-layers (such as a barrier sub-layer), which may include different materials, such as silicon oxide, silicon-aluminum oxide, and cadmium stannate. The front contact 1204 may have a thickness of, for example, between about 100 nanometers (nm) and about 500 nm.

The window layer 1206 is formed above the front contact 1204. In some embodiments, the window layer 1206 includes (e.g., is made of) a n-type semiconductor material, and as such, may also be referred to a "n-type junction partner" (or n-type window layer). One exemplary material that can be used in the window layer is cadmium sulfide. The window layer 1206 may have a thickness of, for example, between about 50 nm and 100 nm.

The light-absorbing layer (or absorber layer) 1208 is formed above the window layer 1206. In some embodiments, the light-absorbing layer 1208 includes (e.g., is made of) a p-type semiconductor material, and as such, may also be referred to as a "p-type absorber layer." In some embodiments, the light-absorbing layer includes cadmium telluride. The light-absorbing layer 1208 may have a thickness of, for example, between about 20 nm about 100 nm.

The electron reflector layer 1210 is formed above the light absorbing layer 1208. In some embodiments, the electron reflector layer 1210 includes (or is made of) CMT, such as the zinc blende CMT formed in cation-rich processing conditions, as described above.

Still referring to FIG. 12, the back contact (or back contact layer) 1212 is formed above the electron reflector layer 1210. In some embodiments, the back contact 1212 includes zinc telluride. The back contact 1212 may have a thickness of, for example, between about 100 nm and about 500 nm.

The deposition of the back contact 1210 may substantially complete the formation of the photovoltaic device 1200. However, in some embodiments, additional components may also be provided to/formed on the photovoltaic device 1200, such as contact terminals for the front contact 1204 and the back contact 1210 and a glass backing layer positioned above the back contact 1210.

As will be understood by one skilled in the art, a p-n junction is formed at the interface between the window layer 1206 and the light-absorbing layer 1208. When the photovoltaic device 1200 is exposed to sunlight, photons are absorbed at the p-n junction, which results in the creation of photo-generated electron-hole pairs. Movement of the electron-hole pairs is influenced by a built-in electric field, which produces current flow. The current flow occurs between a first terminal that is electrically connected to the front contact 1204 and a second terminal that is electrically connected to the back contact 1210.

Thus, in some embodiments, a method for forming CMT is provided. A substrate is positioned in a processing chamber of a PVD tool. The PVD tool includes at least one target in the processing chamber. The at least one target comprising cadmium, manganese, tellurium, or a combination thereof. Dimethyl cadmium gas is introduced into the processing chamber. Material is caused to be ejected from the at least one target. The ejected material forms CMT above the substrate.

In some embodiments, a method for forming CMT is provided. A substrate is positioned within in a processing chamber of a PVD tool. The PVD tool includes a first target, a second target, and a third target in the processing chamber. The first target includes cadmium telluride. The second target includes manganese telluride. The third target includes cadmium, manganese, or a combination thereof.

In some embodiments, a method for forming CMT is provided. A first monolayer is formed above a substrate. The first monolayer includes CMT. A second monolayer is formed above the first monolayer. The second monolayer includes cadmium or manganese. A third monolayer is formed above the second monolayer. The third monolayer includes CMT.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming cadmium-manganese-telluride (CMT), the method comprising:
    positioning a substrate in a processing chamber of a physical vapor deposition (PVD) tool, wherein the PVD tool further comprises at least one target in the processing chamber, the at least one target including material comprising cadmium, manganese, tellurium, or a combination thereof;
    introducing dimethyl cadmium gas into the processing chamber; and
    causing said material to be ejected from the at least one target, the material forming CMT above the substrate.

2. The method of claim 1, wherein the substrate comprises a zinc blend crystal structure.

3. The method of claim 2, wherein the substrate comprises cadmium telluride.

4. The method of claim 1, wherein during the causing of the material to be ejected from the at least one target, a processing temperature within the processing chamber is between about 25° C. and about 600° C.

5. The method of claim 1, wherein the at least target comprises a first target comprising cadmium telluride and a second target comprising manganese telluride.

6. The method of claim 3, wherein the substrate further comprises glass.

7. A method for forming cadmium-manganese-telluride (CMT), the method comprising:
    positioning a substrate in a processing chamber of a physical vapor deposition (PVD) tool, wherein the PVD tool further comprises a first target, a second target, and a third target in the processing chamber, wherein the first target includes material comprising cadmium telluride, the second target includes material comprising manganese telluride, and the third target includes a cation-rich material comprising cadmium, manganese, or a combination thereof; and
    causing said material to be ejected from the first target, the second target, and the third target, the material forming a cation-rich CMT above the substrate.

8. The method of claim 7, wherein the substrate comprises a zinc blend crystal structure.

9. The method of claim 8, wherein the substrate comprises cadmium telluride.

10. The method of claim 9, wherein the third target is made of cadmium or manganese.

11. The method of claim 10, wherein during the causing of the material to be ejected from the at least one target, a processing temperature within the processing chamber is between about 25° C. and about 600° C.

12. The method of claim 10, further comprising introducing dimethyl cadmium gas into the processing chamber before the causing of the material to be ejected from the first target, the second target, and the third target.

13. A method for forming cadmium-manganese-telluride (CMT), the method comprising:
   forming a first monolayer above a substrate, wherein the first monolayer comprises CMT, and wherein the substrate comprises cadmium telluride in a zinc blend crystal structure;
   forming a second monolayer above the first monolayer, wherein the second monolayer comprises a cation-rich material comprising cadmium or manganese; and
   forming a third monolayer above the second monolayer, wherein the third monolayer comprises CMT; and
   further comprising forming a layer of CMT above the substrate before the forming of the first monolayer, wherein the forming of the layer of CMT above the substrate is performed using physical vapor deposition (PVD).

14. The method of claim 13, wherein the substrate further comprises glass.

* * * * *